US012640223B2

(12) United States Patent　　　(10) Patent No.:　US 12,640,223 B2

Su et al.　　　(45) Date of Patent:　May 26, 2026

---

(54) REDUCING PARTIAL BLOCK PROGRAMMING USING DYNAMIC TRIM SETTINGS

(71) Applicant: Micron Technology, Inc., Boise, ID (US)

(72) Inventors: Qun Su, Boise, ID (US); Pitamber Shukla, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 84 days.

(21) Appl. No.: 18/676,267

(22) Filed: May 28, 2024

(65) Prior Publication Data

US 2024/0412803 A1　　Dec. 12, 2024

Related U.S. Application Data

(60) Provisional application No. 63/506,424, filed on Jun. 6, 2023.

(51) Int. Cl.
*G11C 29/12*　　　(2006.01)
*G11C 29/46*　　　(2006.01)

(52) U.S. Cl.
CPC ........ *G11C 29/46* (2013.01); *G11C 29/12005* (2013.01); *G11C 29/1201* (2013.01); *G11C 2029/1202* (2013.01)

(58) Field of Classification Search
CPC ............. G11C 29/46; G11C 29/12005; G11C 29/1201; G11C 2029/1202; G11C 29/021; G11C 29/028
See application file for complete search history.

(56) References Cited

U.S. PATENT DOCUMENTS

2007/0171722 A1* 7/2007 Kang ................. G11C 16/3459
　　　　　　　　　　　　　　　　　　365/185.18

* cited by examiner

*Primary Examiner* — Xiaochun L Chen

(74) *Attorney, Agent, or Firm* — NICHOLSON DE VOS WEBSTER & ELLIOTT LLP

(57)　　　　　ABSTRACT

Exemplary methods, apparatuses, and systems write data to a first wordline of a partially programmed block of memory. A second wordline of the block is determined to fail to satisfy a first margin threshold by comparing a first voltage threshold of the second wordline to a reference voltage. In response to the second wordline failing to satisfy the first margin threshold, a second margin test is applied to the block. In response to determining the block passed the second margin test, data is written in a subsequent write operation to the block using an adjusted trim setting.

20 Claims, 5 Drawing Sheets

400

WRITE DATA TO A FIRST WORDLINE OF A PARTIALLY PROGRAMMED BLOCK OF A MEMORY SUBSYSTEM
405

DETERMINE A SECOND WORDLINE FAILS TO SATISFY A MARGIN THRESHOLD BY COMPARING A VOLTAGE THRESHOLD VALUE OF THE SECOND WORDLINE TO A REFERENCE VOLTAGE
410

IN RESPONSE TO THE SECOND WORDLINE FAILING TO SATISFY THE FIRST MARGIN THRESHOLD, APPLY A SECOND MARGIN TEST TO THE BLOCK
415

IN RESPONSE TO DETERMINING THE BLOCK PASSED THE SECOND MARGIN TEST, USE AN ADJUSTED TRIM SETTING TO WRITE DATA IN A SUBSEQUENT OPERATION TO THE BLOCK
420

Figure 1:
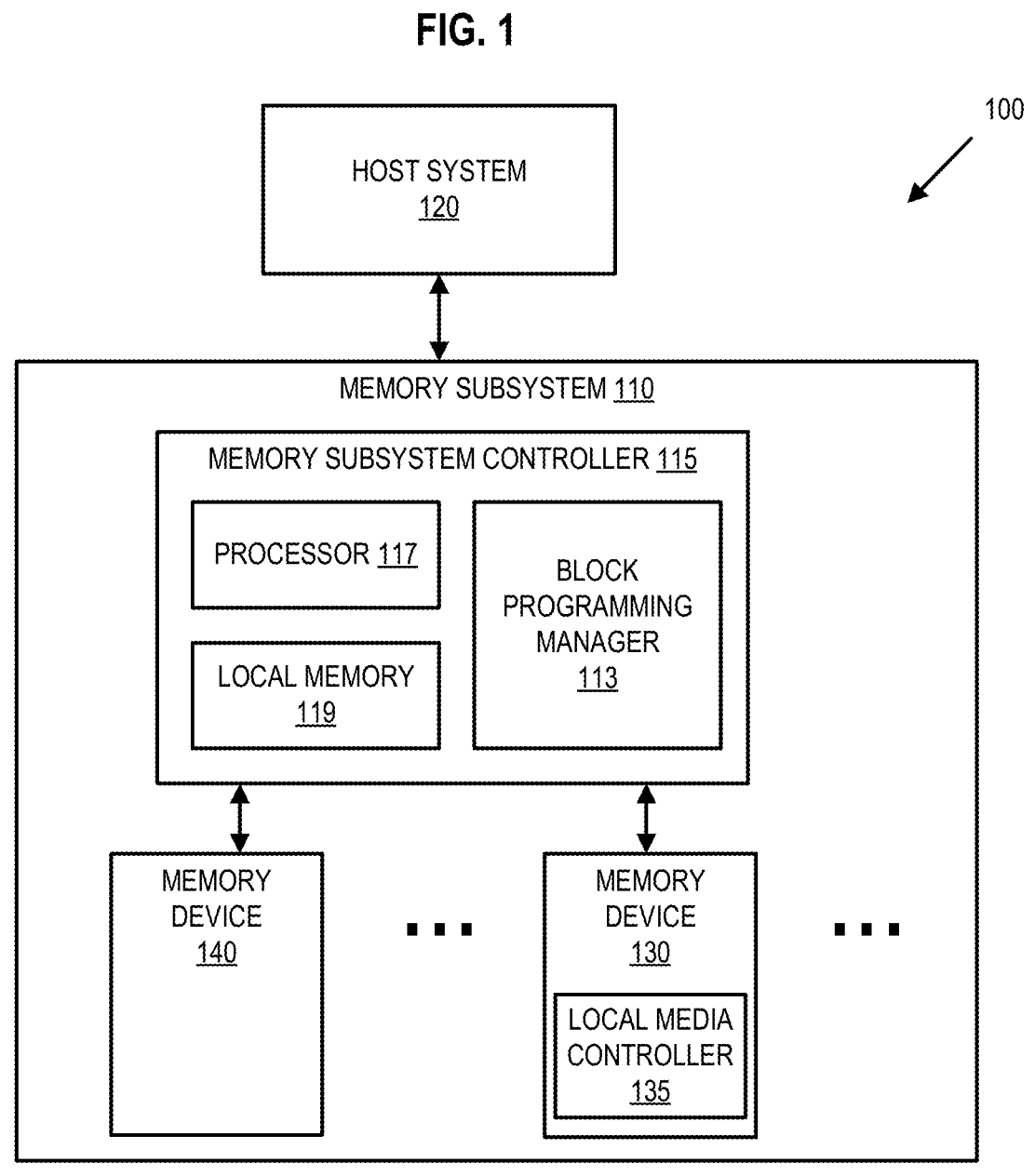

HOST SYSTEM
120

MEMORY SUBSYSTEM 110

MEMORY SUBSYSTEM CONTROLLER 115

PROCESSOR 117

LOCAL MEMORY
119

BLOCK
PROGRAMMING
MANAGER
113

MEMORY
DEVICE
140

· · ·

MEMORY
DEVICE
130

LOCAL MEDIA
CONTROLLER
135

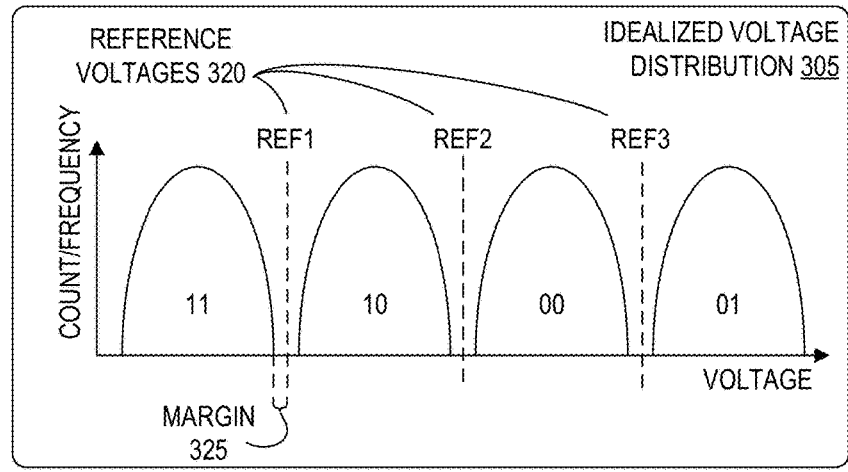

REFERENCE VOLTAGES 320

IDEALIZED VOLTAGE DISTRIBUTION 305

COUNT/FREQUENCY

REF1    REF2    REF3

11    10    00    01

VOLTAGE

MARGIN 325

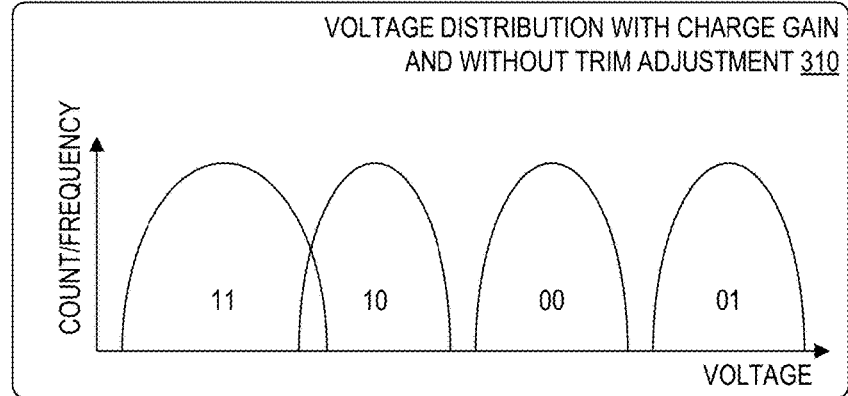

VOLTAGE DISTRIBUTION WITH CHARGE GAIN AND WITHOUT TRIM ADJUSTMENT 310

COUNT/FREQUENCY 11    10    00    01

VOLTAGE

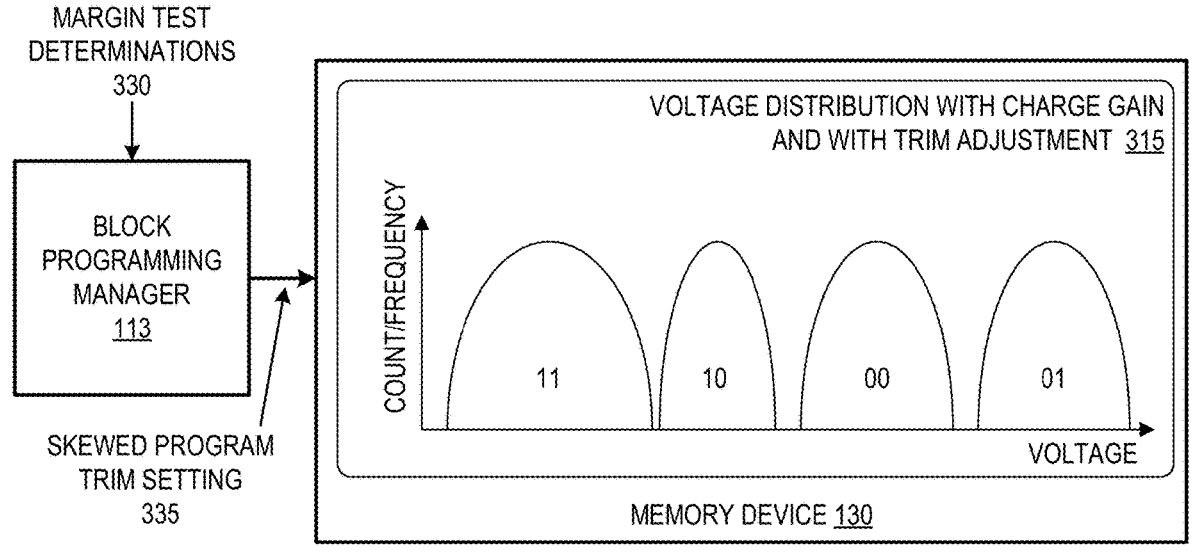

MARGIN TEST DETERMINATIONS 330

BLOCK PROGRAMMING MANAGER 113

SKEWED PROGRAM TRIM SETTING 335

VOLTAGE DISTRIBUTION WITH CHARGE GAIN AND WITH TRIM ADJUSTMENT 315

COUNT/FREQUENCY 11    10    00    01

VOLTAGE

MEMORY DEVICE 130

Figure 4:
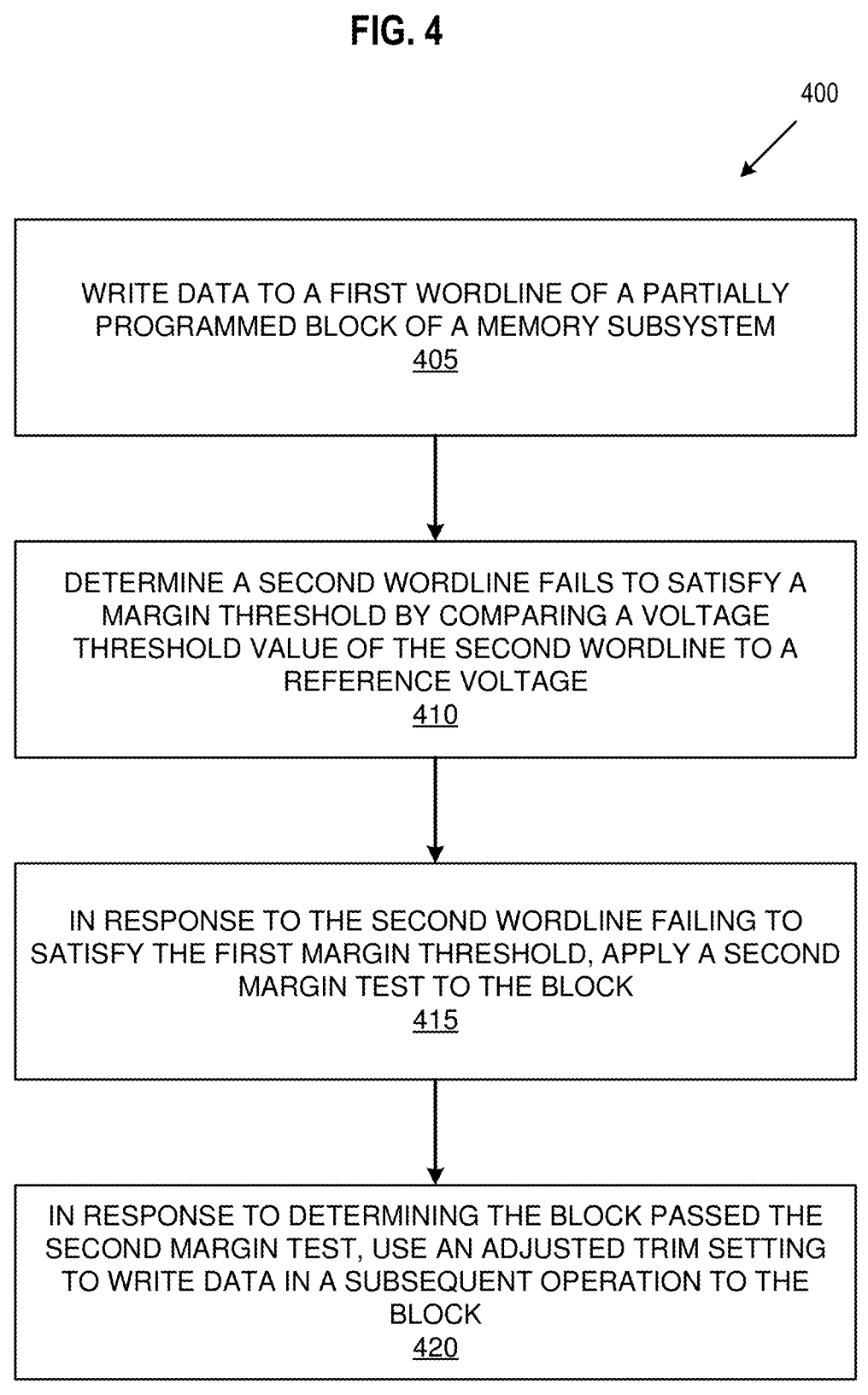

WRITE DATA TO A FIRST WORDLINE OF A PARTIALLY PROGRAMMED BLOCK OF A MEMORY SUBSYSTEM
405

DETERMINE A SECOND WORDLINE FAILS TO SATISFY A MARGIN THRESHOLD BY COMPARING A VOLTAGE THRESHOLD VALUE OF THE SECOND WORDLINE TO A REFERENCE VOLTAGE
410

IN RESPONSE TO THE SECOND WORDLINE FAILING TO SATISFY THE FIRST MARGIN THRESHOLD, APPLY A SECOND MARGIN TEST TO THE BLOCK
415

IN RESPONSE TO DETERMINING THE BLOCK PASSED THE SECOND MARGIN TEST, USE AN ADJUSTED TRIM SETTING TO WRITE DATA IN A SUBSEQUENT OPERATION TO THE BLOCK
420

500

REDUCING PARTIAL BLOCK PROGRAMMING USING DYNAMIC TRIM SETTINGS

CROSS-REFERENCE TO RELATED APPLICATION

The present application claims the benefit of U.S. Provisional Patent Application No. 63/506,424 filed on Jun. 6, 2023, which is incorporated by reference herein in its entirety.

TECHNICAL FIELD

The present disclosure generally relates to managing the programming of memory, and more specifically, relates to using dynamic trim settings to reduce the partial programming of blocks of memory.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 1 illustrates an example computing system that includes a memory subsystem in accordance with some embodiments of the present disclosure.

FIG. 3 illustrates example voltage distributions with and without the use of margin tests to dynamically skew program trim settings in accordance with some embodiments of the present disclosure.

FIG. 4 is a flow diagram of another example method of using dynamic trim settings to reduce the partial programming of blocks of memory in accordance with some embodiments of the present disclosure.

DETAILED DESCRIPTION

Figure 2:
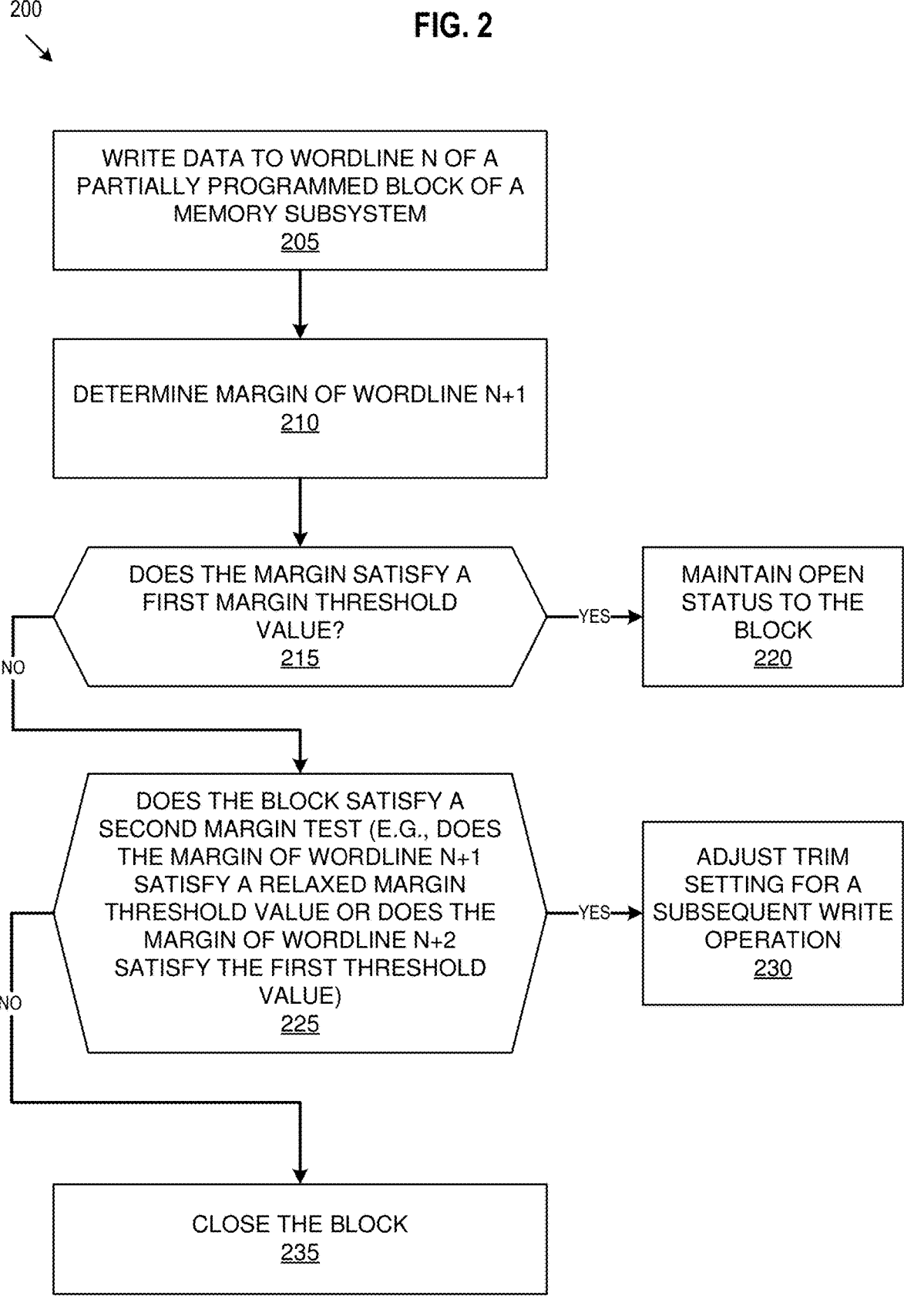
FIG. 2 is a flow diagram of an example method of using dynamic trim settings to reduce the partial programming of blocks of memory in accordance with some embodiments of the present disclosure.

Aspects of the present disclosure are directed to using dynamic trim settings to reduce the partial programming of blocks of a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1" or combinations of such values. There are various types of cells, such as single-level cells (SLCs), multi-level cells (MLCs), triple-level cells (TLCs), quad-level cells (QLCs), and octo-level cells (OLC). For example, an SLC can store one bit of information and has two logic states.

Data reliability in a memory can degrade as the memory device increases in density (e.g., device components scale down in size, when multiple bits are programmed per cell, etc.). To accommodate this physical and logical scaling, memory systems often are designed to optimize either performance, such as write/erase speed, or reliability, such as data retention. In typical systems, the memory system design is tailored to a single optimization goal. For example, optimization for performance can result in diminished reliability in terms of narrower voltage threshold curves. However, as the memory devices continue to scale, voltage/ charge gain between wordlines increases. This voltage gain can result in premature or excessive block closures of partial blocks. For example, typical systems monitor partial blocks using an erase status scan on wordlines that are unprogrammed. The erase scan monitors the unprogrammed wordline nearest to the last programmed wordline to check for voltage gain, e.g., in terms of an elevated erase state voltage threshold. If the erase scan check fails on this wordline, programming additional data to the next wordline has a greater level of risk of data loss due to a shallow erase state. As a result, the block is closed for further writing. While the next unprogrammed wordline may have failed the erase scan check, closing the block forgoes the opportunity to write to other wordlines that had less voltage gain and remain sufficient reliable.

Aspects of the present disclosure address the above and other deficiencies by monitoring the margin between voltage thresholds of a portion of memory and one or more reference voltages. Rather than closing a partially programmed block in response to a failed margin test on an unprogrammed wordline, embodiments perform a second margin test to determine if the block is to remain conditionally open. For example, when the memory subsystem detects that a first unprogrammed wordline fails a first margin test, it determines the block can remain conditionally open when a second unprogrammed wordline of the block passes a similar test. As another example, the memory subsystem determines the block can remain conditionally open when the first unprogrammed wordline passes a relaxed margin test. The memory subsystem uses an adjusted trim setting when programming one or more subsequent wordlines in the block when in a conditionally open state. As a result, embodiments remediate the impact of charge gain while reducing the number of blocks closed in a partially programmed state. Further, this approach lowers cycling wear-out of memory from block folding.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a block programming manager 113 that manages dynamic trim settings and the closure of partially written blocks. In some embodiments, the controller 115 includes at least a portion of the block programming manager 113. For example, the controller 115 can include a processor 117 (processing device) configured to execute instructions stored in local memory 119 for performing the operations described herein. In some embodiments, the block programming manager 113 is part of the host system 120, an application, or an operating system.

The block programming manager 113 writes data to blocks of memory in the memory system 110. During a write operation to a block, the programming of wordlines causes charge gain on adjacent or nearby wordlines. For example, an unprogrammed wordline adjacent to the most recently programmed wordline can shift into a shallow erase state due to such charge gain. A wordline in a shallow erase state that is subsequently programmed can result in a program operation erroneously setting memory cells within the wordline to a threshold voltage of a different program state (e.g., a threshold voltage that maps to a reference voltage associated with a value of "110" rather than the intended value of "111"). To prevent such errors, the block programming manager 113 performs voltage threshold margin test for one or more wordlines that are adjacent to or otherwise near the last written wordline $WL_n$. For example, the block programming manager 113 tests the voltage threshold margin for the next wordline, $WL_{n+1}$. If the wordline fails an initial voltage threshold margin test, block programming manager 113 performs a second voltage threshold margin test to determine if the block can remain conditionally open. The second voltage threshold margin test can include a relaxed test of the same wordline, $WL_{n+1}$, or a test similar to the initial voltage threshold margin test on a different wordline, such as the next unprogrammed wordline, $WL_{n+2}$. When the block programming manager 113 determines a block can remain conditionally open (i.e., the block failed a first voltage threshold margin test but passed a second voltage threshold margin test), the block programming manager 113 adjusts one or more trim settings for programming one or more remaining wordlines in the block. Additional details of the management of dynamic trim settings and the closure of partially written blocks are set forth below with reference to FIGS. 2-5.

FIG. 2 is a flow diagram of an example method 200 of using dynamic trim settings to reduce the partial programming of blocks of memory in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the block programming manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the block programming manager 113 writes data to a wordline of a block of memory. For example, the block programming manager 113 receives data bits from the host system 120 for programming to an open block of memory. The block is in a partially programmed state. For example, the programming is not the last wordline to be programmed in the block. For reference in the examples set forth below, block programming manager 113 writes data to wordline N ($WL_n$).

At operation 210, the block programming manager 113 determines a voltage threshold margin for another wordline within the block. For example, block programming manager 113 determines the margin of the next unprogrammed wordline (wordline N+1 or $WL_{n+1}$), by comparing a voltage threshold value of $WL_{n+1}$ to a reference voltage. This margin serves as an indication of charge gain, if any, due to the programming of data at operation 205 (and/or as a result of one or more read operations, simple bake/retention, etc.). In one embodiment, $WL_{n+1}$ is adjacent to $WL_n$. Voltage thresholds, reference voltages, and margins are illustrated in and described further with reference to FIG. 3.

At operation 215, the block programming manager determines whether the voltage threshold margin of the next unprogrammed wordline satisfies a first margin threshold value. For example, the block programming manager 113 determines if at least a threshold voltage value separates a distribution of threshold voltages for an erased state and a reference voltage that separates the erased state and an adjacent programming state.

In some embodiments, the block programming manager 113 bypasses operation 210 and determines if the threshold margin of the wordline satisfies the first margin threshold value by comparing one or more threshold voltages to the first margin threshold value. For example, if a threshold voltage is less than the first margin threshold value, the block programming manager 113 determines that the wordline satisfies this first margin test. If the threshold voltage is greater than the first margin threshold value, the block programming manager 113 determines that the wordline fails this first margin test.

If the voltage threshold margin of the next unprogrammed wordline satisfies the first margin threshold value (or otherwise passes the first margin test), the method 200 proceeds to operation 220. If the voltage threshold margin of the next unprogrammed wordline does not satisfy the first margin threshold value (or otherwise fails the first margin test), the method 200 proceeds to operation 225.

At operation 220, the block programming manager 113 maintains an open status for the block. For example, the block programming manager 113 retains the current trim settings of the block and permits subsequent write operations to the block. In one embodiment, maintaining the open status maintains current trim settings, such as reference voltage values, program verify levels, and programming pulse parameters, such as programming start voltage, program pulse ramp rate, and program pulse step size.

At operation 225, the block programming manager 113 determines if the block satisfies a second margin test. In some embodiments, the second margin test is performed on another wordline. For example, the block programming manager 113 determines if another unprogrammed wordline, such as $WL_{n+2}$, satisfies the first margin threshold value or otherwise passes the first margin test, similar to the test of $WL_{n+1}$ described with reference to operation 215. In some embodiments, the second margin test is performed on the same wordline and uses a relaxed margin threshold value. For example, block programming manager 113 determines if the voltage threshold margin of the wordline ($WL_{n+1}$) satisfies a second margin threshold that is relaxed in comparison to the first margin threshold value (e.g., the second margin threshold allows for less margin between threshold voltages and a reference voltage). In one embodiment, the second margin threshold value is greater than the first margin threshold value.

If the block satisfies the second margin test, the method 200 proceeds to operation 230. If the block does not satisfy the second margin test, the method 200 proceeds to operation 235.

At operation 230, the block programming manager 113 updates the block to a conditionally open status. For example, the block programming manager 113 adjusts one or more trim settings for a subsequent write operation to the block. In some embodiments, the block programming manager 113 adjusts a programming step voltage. In adjusting the programming step voltage, the block programming manager 113 reduces the impact of charge gain by increasing the threshold voltage values for at least one programmed state. In some embodiments, the block programming manager 113 adjusts a program verify level for a programmed state. For example, the block programming manager 113 can increase the threshold voltage level used to verify a value of a programmed state L1 adjacent to an erased state L0 to improve voltage threshold distribution margins between states. In some embodiments, the block programming manager 113 adjusts a reference voltage used to differentiate threshold voltages of different programming states. Additional examples of adjusting a trim setting include: lowering the programming step size (i.e., the Vt progress per program pulse), increasing the programming starting voltage, updating the pre-program verify level, updating the pulse ramping rate, etc.

At operation 235, the block programming manager 113 closes the block of memory. By closing the block, the block programming manager 113 prevents subsequent writes to the block, leaving it partially programmed.

FIG. 3 illustrates example voltage distributions with and without the use of margin tests to dynamically skew program trim settings in accordance with some embodiments of the present disclosure. The examples include voltage threshold distributions for a wordline programmed under ideal conditions 305, a wordline impacted by charge gain in the erased state and programmed without trim adjustment 310, and a wordline impacted by charge gain in the erased state and programmed with trim adjustment 315. When the controller 115 reads a group of memory cells from the media, the controller 115 obtains population data related to the read or sensed voltages when accessing the cells. The read or sensed voltages are referred to as the threshold voltages. The obtained population data can be accumulated by the controller 115 or obtained directly from another controller (not shown) associated with a memory device 130. The group of memory cells is a group of cells that can be read as a unit (e.g., a wordline), and the population data indicates, relative to one or more read thresholds, which sensed voltages should be interpreted as which values. For example, in SLC memory, a single threshold distinguishes between 0's and 1's (e.g., read voltages above the threshold are interpreted as a 0 and read voltages below the threshold are interpreted as a 1).

As illustrated in the example idealized voltage distribution 305, a distribution of read voltages from MLC memory storing two-bits per cell is plotted. In this example, three read reference voltages 320 REF1, REF2, and REF3 distinguish between the two-bit values 00, 01, 10, and 11. In particular, read voltages less than REF1 correspond to a value of 11 (also referred to as voltage level 0 or L0), read voltages between REF1 and REF2 correspond to a value of 10 (also referred to as voltage level 1 or L1), read voltages between REF2 and REF3 correspond to a value of 00 (also referred to as voltage level 2 or L2), and read voltages at or above REF3 correspond to a value of 01 (also referred to as voltage level 3 or L3). Notably, in this idealized example, the curve representing the 11 values does not extend beyond REF1, the curve representing 10 does not extend below REF1 or above REF2, etc. Instead, a margin 325 exists between a distribution of threshold voltages for a given voltage level and the corresponding reference voltage. Media with other bit densities have different numbers of reference voltages (e.g., SLC has at least one reference voltage, MLC with two-bits per cell has at least three reference voltages, TLC with three bits per cell has at least 7 reference voltages, QLC with four bits per cell has at least 15 reference voltages, etc.). For the sake of illustration, the bit value of 11 is also referred to as an erased state.

Charge gain, e.g., resulting from programming a wordline adjacent or near to an unprogrammed wordline, can elevate the erased state voltage values for the unprogrammed wordline. As illustrated in the voltage distribution of a wordline programmed without trim adjustment 310, the distribution curves of two program states (11 and 10) overlap due to charge gain, resulting in some cells being interpreted as storing a different value than intended. For example, cells that are supposed to be in an erased state may have a read voltage above REF1, which the controller 115 interprets as storing a value of 10. This is a source of RBER and can result in an uncorrectable error.

When the block programming manager 113 uses margin test determinations 330 described above (e.g., with reference to operation 215 and operation 225), the block programming manager 113 adjusts the block to a conditionally open status and uses a skewed (or otherwise updated) program trim setting 335. For example, the block programming manager 113 uses skewed program trim setting(s) 335, as described with reference to operation 230, to shift threshold voltage values for L1 (i.e., the programmed state for a value of 10) and reduce overlap with threshold voltage values for L0 (i.e., the erased state corresponding to a value of 11)

FIG. 4 is a flow diagram of an example method 400 of using dynamic trim settings to reduce the partial programming of blocks of memory in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the block programming manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the block programming manager 113 writes data to a first wordline of a block of a memory subsystem. The block is in a partially programmed state. In other words, the programming is not the last wordline to be programmed in the block. For example, the block programming manager 113 writes the data to $WL_n$ in response to a communication from the host system as described above at operation 205.

At operation 410, the block programming manager determines a second wordline fails to satisfy a margin threshold by comparing a first voltage threshold value of the second wordline to a reference voltage threshold. For example, the block programming manager 113 determines the voltage threshold margin of the next unprogrammed wordline, $WL_{n+1}$, does not satisfy the first margin threshold value (or otherwise fails the first margin test) as described above at operation 215.

At operation 415, the block programming manager 113 applies a second margin test to the block in response to determining that the second wordline fails to satisfy the margin threshold. For example, the block programming manager 113 applies a relaxed margin test to the same wordline ($WL_{n+1}$) or a similar margin test to different wordline ($WL_{n+2}$) in the block as described above at operation 225.

At operation 420, in response to determining the block passed the second margin test, the block programming manager 113 uses an adjusted trim setting to write data in a subsequent write operation for the block. For example, the block programming manager 113 updates the block to a conditionally open status and adjusts one or more settings as described above at operation 230.

Figure 5:
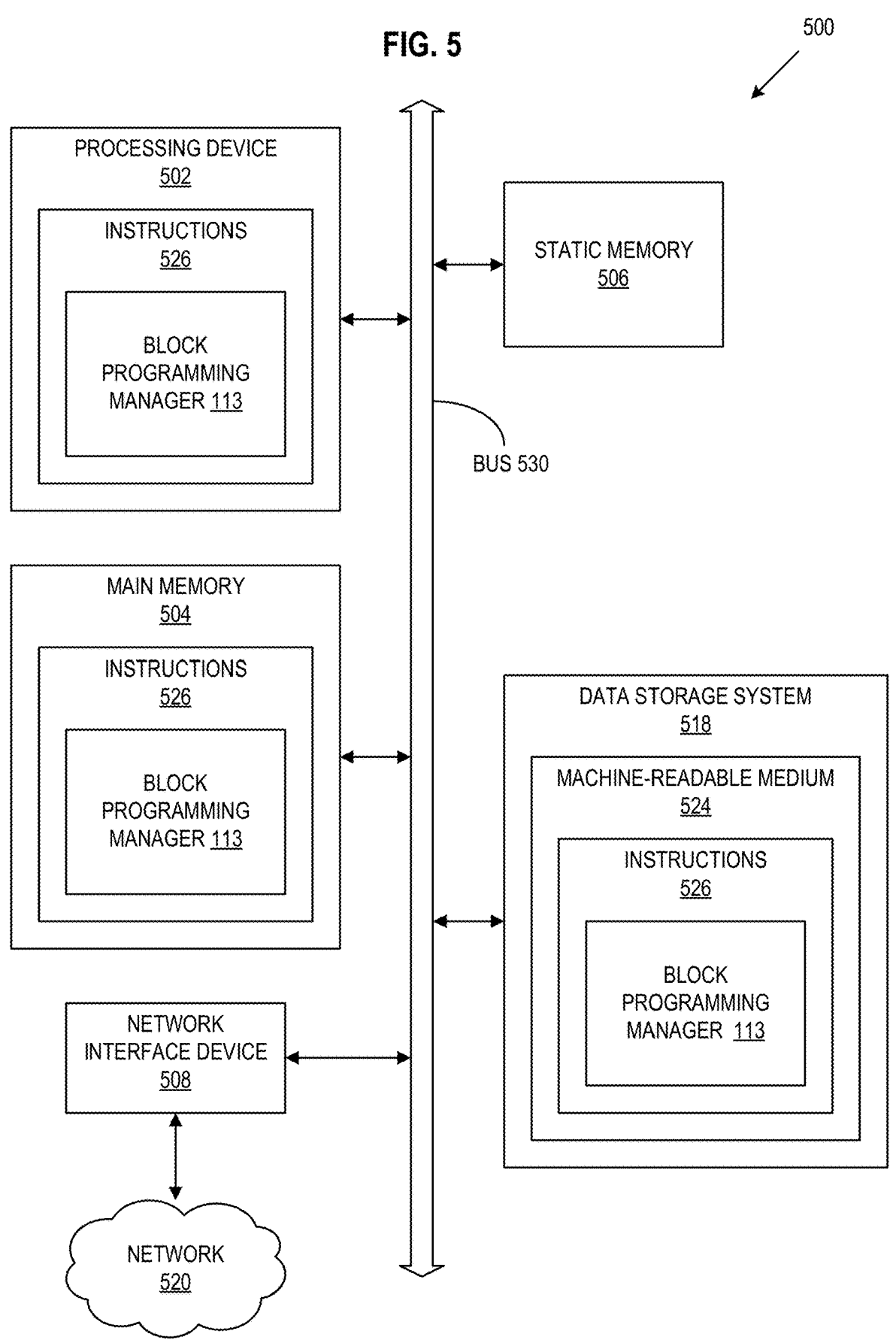
FIG. 5 is a block diagram of an example computer system in which embodiments of the present disclosure may operate.

FIG. 5 illustrates an example machine of a computer system 500 within which a set of instructions for causing the machine to perform any one or more of the methodologies discussed herein can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to block programming manager 113 of FIG. 1). In alternative embodiments, the machine can be connected (e.g., networked) to other machines in a LAN, an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random-access memory (DRAM) such as synchronous DRAM (SDRAM) or Rambus DRAM (RDRAM), etc.), a static memory 506 (e.g., flash memory, static random-access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a wireless update performance manager (e.g., the block programming manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
writing data to a first wordline of a first block of memory in a memory subsystem, wherein the first block is a partially programmed block;
determining a second wordline of the first block fails to satisfy a first margin threshold by comparing a first voltage threshold of the second wordline to a first reference voltage, wherein the second wordline is an unprogrammed wordline;
in response to the second wordline failing to satisfy the first margin threshold, applying a second margin test to the first block; and
in response to determining the first block passed the second margin test, writing data in a subsequent write operation to the first block using an adjusted trim setting.

2. The method of claim 1, wherein the adjusted trim setting narrows a voltage distribution of a program state in the second wordline relative to the voltage distribution of the program state in the first wordline.

3. The method of claim 2, wherein the first voltage threshold is for an erase state of the second wordline and wherein the adjusted trim setting narrows the voltage distribution for a programmed state adjacent to the erase state.

4. The method of claim 1, wherein the second margin test includes determining a second margin value of a third wordline of the first block by comparing a second voltage threshold of the third wordline to the first reference voltage.

5. The method of claim 1, wherein the second margin test includes comparing the first voltage threshold of the second wordline to a second reference voltage.

6. The method of claim 1, further comprising:

writing data to a third wordline of a second block of memory in the memory subsystem;

determining a second margin value of a fourth wordline of the second block by comparing a second voltage threshold of the fourth wordline to the first reference voltage;

in response to the first margin value failing to satisfy the first margin threshold, applying the second margin test to the block; and in response to determining the second block failed the second margin test, closing the second block in a partially programmed state, wherein closing the second block prevents writes to unprogrammed wordlines in the second block.

7. The method of claim 1, wherein the second wordline is adjacent to the first wordline.

8. A non-transitory computer-readable storage medium comprising instructions that, when executed by a processing device, cause the processing device to:

write data to a first wordline of a first block of memory in a memory subsystem, wherein the first block is a partially programmed block;

determine a second wordline of the first block fails to satisfy a first margin threshold by comparing a first voltage threshold of the second wordline to a first reference voltage, wherein the second wordline is an unprogrammed wordline;

in response to the second wordline failing to satisfy the first margin threshold, apply a second margin test to the first block; and in response to determining the first block passed the second margin test, write data in a subsequent write operation to the first block using an adjusted trim setting.

9. The non-transitory computer-readable storage medium of claim 8, wherein the adjusted trim setting narrows a voltage distribution of a program state in the second wordline relative to the voltage distribution of the program state in the first wordline.

10. The non-transitory computer-readable storage medium of claim 9, wherein the first voltage threshold is for an erase state of the second wordline and wherein the adjusted trim setting narrows the voltage distribution for a programmed state adjacent to the erase state.

11. The non-transitory computer-readable storage medium of claim 8, wherein the second margin test includes determining a second margin value of a third wordline of the first block by comparing a second voltage threshold of the third wordline to the first reference voltage.

12. The non-transitory computer-readable storage medium of claim 8, wherein the second margin test includes comparing the first voltage threshold of the second wordline to a second reference voltage.

13. The non-transitory computer-readable storage medium of claim 8, wherein the processing device is further caused to:

write data to a third wordline of a second block of memory in the memory subsystem;

determine a second margin value of a fourth wordline of the second block by comparing a second voltage threshold of the fourth wordline to the first reference voltage;

in response to the first margin value failing to satisfy the first margin threshold, apply the second margin test to the block; and in response to determining the second block failed the second margin test, close the second block in a partially programmed state, wherein closing the second block prevents writes to unprogrammed wordlines in the second block.

14. The non-transitory computer-readable storage medium of claim 8, wherein the second wordline is adjacent to the first wordline.

15. A system comprising:

a memory device; and a processing device, operatively coupled with the memory device, to:

write data to a first wordline of a first block of memory in the memory device, wherein the first block is a partially programmed block;

determine a second wordline of the first block fails to satisfy a first margin threshold by comparing a first voltage threshold of the second wordline to a first reference voltage, wherein the second wordline is an unprogrammed wordline adjacent to the first wordline;

in response to the second wordline failing to satisfy the first margin threshold, apply a second margin test to the first block; and in response to determining the first block passed the second margin test, write data in a subsequent write operation to the first block using an adjusted trim setting.

16. The system of claim 15, wherein the adjusted trim setting narrows a voltage distribution of a program state in the second wordline relative to the voltage distribution of the program state in the first wordline.

17. The system of claim 16, wherein the first voltage threshold is for an erase state of the second wordline and wherein the adjusted trim setting narrows the voltage distribution for a programmed state adjacent to the erase state.

18. The system of claim 15, wherein the second margin test includes determining a second margin value of a third wordline of the first block by comparing a second voltage threshold of the third wordline to the first reference voltage.

19. The system of claim 15, wherein the second margin test includes comparing the first voltage threshold of the second wordline to a second reference voltage.

20. The system of claim 15, wherein the processing device is further caused to:

write data to a third wordline of a second block of memory in the memory device;

determine a second margin value of a fourth wordline of the second block by comparing a second voltage threshold of the fourth wordline to the first reference voltage;

in response to the second margin value failing to satisfy the first margin threshold, apply the second margin test to the block; and in response to determining the second block failed the second margin test, close the second block in a partially programmed state, wherein closing the second block prevents writes to unprogrammed wordlines in the second block.

* * * * *